United States Patent
Singh et al.

(10) Patent No.: US 9,118,825 B2
(45) Date of Patent: Aug. 25, 2015

(54) ATTACHMENT OF WAFER LEVEL OPTICS

(75) Inventors: Harpuneet Singh, Dublin, CA (US); Irmina Carpio, San Jose, CA (US); Guan Hock Yeow, Kuala Lumpur (MY)

(73) Assignee: NAN CHANG O-FILM OPTOELECTRONICS TECHNOLOGY LTD., NANCHANG (CN)

( * ) Notice: Subject to any disclaimer, the term of this patent is extended or adjusted under 35 U.S.C. 154(b) by 96 days.

(21) Appl. No.: 12/368,454

(22) Filed: Feb. 10, 2009

(65) Prior Publication Data
US 2009/0213262 A1  Aug. 27, 2009

Related U.S. Application Data

(60) Provisional application No. 61/030,937, filed on Feb. 22, 2008.

(51) Int. Cl.
*H04N 5/225* (2006.01)
*G02B 7/02* (2006.01)
*G02B 13/00* (2006.01)
*H01L 27/146* (2006.01)

(52) U.S. Cl.
CPC .............. *H04N 5/2254* (2013.01); *G02B 7/021* (2013.01); *G02B 13/005* (2013.01); *G02B 13/0035* (2013.01); *G02B 13/0085* (2013.01); *H01L 27/14618* (2013.01); *H01L 27/14625* (2013.01); *H01L 27/14685* (2013.01); *G02B 13/001* (2013.01)

(58) Field of Classification Search
CPC .................................................... H04N 5/2254
USPC .................................................. 348/340, 335
See application file for complete search history.

(56) References Cited

U.S. PATENT DOCUMENTS

| 4,681,416 A | 7/1987 | Raschke |
| 4,687,314 A | 8/1987 | Raschke |
| 4,690,512 A | 9/1987 | Forsyth |
| 4,727,389 A | 2/1988 | Raschke |
| 4,987,435 A | 1/1991 | Touma et al. |

(Continued)

FOREIGN PATENT DOCUMENTS

| CN | 1517735 A | 8/2004 |
| EP | 1 441 509 A2 | 7/2004 |

(Continued)

OTHER PUBLICATIONS

NPL: Online Merriam-Webster Dictionary; Attach definition; http://www.merriam-webster.com/dictionary/attach.*

(Continued)

*Primary Examiner* — Roberto Velez
*Assistant Examiner* — Cynthia Segura
(74) *Attorney, Agent, or Firm* — Novak Druce Connolly Bove + Quigg LLP

(57) ABSTRACT

A technique for assembling camera modules that includes attaching optical elements, such as an optics stack, directly to the upper surface of an image sensor. A housing may be provided to partially surrounded the optics stack. Alternatively, the housing can be provided by a transfer molding process. This technique can be applied in array processing scenario and solder balls can be attached to the bottom of the image sensor to provide an efficiently-produced and low cost camera module.

15 Claims, 7 Drawing Sheets

(56) References Cited

U.S. PATENT DOCUMENTS

| | | | |
|---|---|---|---|
| 5,149,181 A | 9/1992 | Bedford | |
| 5,529,936 A | 6/1996 | Rostoker | |
| 5,815,742 A | 9/1998 | Hamada et al. | |
| 5,866,942 A | 2/1999 | Suzuki et al. | |
| 6,249,311 B1 | 6/2001 | Rouse et al. | |
| 6,255,640 B1* | 7/2001 | Endo et al. | 250/208.1 |
| 6,330,400 B1 | 12/2001 | Bittner et al. | |
| 6,381,072 B1 | 4/2002 | Burger | |
| 6,582,079 B2 | 6/2003 | Levine | |
| 6,670,205 B1 | 12/2003 | Byun | |
| 6,683,298 B1 | 1/2004 | Hunter et al. | |
| 6,686,588 B1 | 2/2004 | Webster et al. | |
| 6,841,883 B1 | 1/2005 | Farnworth et al. | |
| 6,853,005 B2 | 2/2005 | Ikeda | |
| 6,869,233 B2 | 3/2005 | Westerweck et al. | |
| 6,903,883 B2 | 6/2005 | Amanai | |
| 6,954,311 B2 | 10/2005 | Amanai | |
| 6,995,462 B2 | 2/2006 | Bolken et al. | |
| 7,019,374 B2 | 3/2006 | Kayanuma et al. | |
| 7,043,284 B2 | 5/2006 | Tornaghi | |
| 7,046,296 B2 | 5/2006 | Shinomiya | |
| 7,078,799 B2 | 7/2006 | Vittu | |
| 7,083,999 B2 | 8/2006 | Hashimoto | |
| 7,167,376 B2 | 1/2007 | Miyashita et al. | |
| 7,199,438 B2 | 4/2007 | Appelt et al. | |
| 7,245,319 B1 | 7/2007 | Enomoto | |
| 7,280,149 B2 | 10/2007 | Weintroub et al. | |
| 7,301,577 B2 | 11/2007 | Sakamoto | |
| 7,378,724 B2 | 5/2008 | Yu et al. | |
| 7,388,613 B2 | 6/2008 | Raschke | |
| 7,414,661 B2 | 8/2008 | Hartlove et al. | |
| 7,433,555 B2 | 10/2008 | Lee et al. | |
| 7,457,050 B2 | 11/2008 | Betensky | |
| 7,469,100 B2 | 12/2008 | Toor et al. | |
| 7,477,461 B2 | 1/2009 | Bareau et al. | |
| 7,494,292 B2 | 2/2009 | Kong et al. | |
| 7,531,773 B2 | 5/2009 | Westerweck et al. | |
| 7,593,057 B2 | 9/2009 | Yee et al. | |
| 7,622,786 B2* | 11/2009 | England | 257/434 |
| 7,796,187 B2 | 9/2010 | Shangguan et al. | |
| 7,901,973 B2 | 3/2011 | Yamamoto | |
| 7,939,901 B2 | 5/2011 | Minamio et al. | |
| 8,110,884 B2* | 2/2012 | Bolken et al. | 257/432 |
| 8,300,143 B2* | 10/2012 | Bonkohara | 348/373 |
| 8,481,343 B2* | 7/2013 | Hsin et al. | 438/14 |
| 8,599,301 B2* | 12/2013 | Dowski et al. | 348/340 |
| 2003/0016452 A1 | 1/2003 | Sayag | |
| 2003/0137728 A1 | 7/2003 | Kuroda et al. | |
| 2004/0042779 A1* | 3/2004 | Maeda et al. | 396/79 |
| 2004/0056970 A1 | 3/2004 | Westerweck et al. | |
| 2004/0089859 A1 | 5/2004 | Shirakawa et al. | |
| 2004/0207036 A1 | 10/2004 | Ikeda | |
| 2004/0212719 A1 | 10/2004 | Ikeda | |
| 2004/0245649 A1* | 12/2004 | Imaoka | 257/774 |
| 2005/0030647 A1 | 2/2005 | Amanai | |
| 2005/0046010 A1* | 3/2005 | Vittu | 257/704 |
| 2005/0077458 A1* | 4/2005 | Ma et al. | 250/239 |
| 2005/0146800 A1 | 7/2005 | Yamada et al. | |
| 2005/0179805 A1* | 8/2005 | Avron et al. | 348/340 |
| 2005/0185088 A1 | 8/2005 | Kale et al. | |
| 2005/0237418 A1* | 10/2005 | Sakamoto | 348/340 |
| 2005/0285973 A1 | 12/2005 | Singh et al. | |
| 2006/0001759 A1 | 1/2006 | Raschke | |
| 2006/0006511 A1* | 1/2006 | Roh et al. | 257/680 |
| 2006/0023108 A1 | 2/2006 | Watanabe et al. | |
| 2006/0028573 A1 | 2/2006 | Seo et al. | |
| 2006/0044450 A1 | 3/2006 | Wolterink et al. | |
| 2006/0054787 A1 | 3/2006 | Olsen et al. | |
| 2006/0066959 A1 | 3/2006 | Koga et al. | |
| 2006/0109367 A1 | 5/2006 | Hirooka | |
| 2006/0127085 A1 | 6/2006 | Matsuki et al. | |
| 2006/0132644 A1 | 6/2006 | Shangguan et al. | |
| 2006/0181748 A1 | 8/2006 | Makii et al. | |
| 2006/0215053 A1 | 9/2006 | Kinoshita | |
| 2006/0219885 A1 | 10/2006 | Kinoshita et al. | |
| 2006/0249737 A1* | 11/2006 | Fujimori | 257/79 |
| 2006/0251414 A1 | 11/2006 | Nishizawa | |
| 2007/0019102 A1 | 1/2007 | Nakajo et al. | |
| 2007/0032169 A1 | 2/2007 | Neely et al. | |
| 2007/0037485 A1 | 2/2007 | Neely | |
| 2007/0052050 A1 | 3/2007 | Dierickx | |
| 2007/0053672 A1 | 3/2007 | Westerweck et al. | |
| 2007/0053685 A1 | 3/2007 | Shibata et al. | |
| 2007/0058964 A1 | 3/2007 | Shangguan et al. | |
| 2007/0077051 A1 | 4/2007 | Toor et al. | |
| 2007/0091198 A1* | 4/2007 | Watanabe et al. | 348/340 |
| 2007/0096284 A1* | 5/2007 | Wallace | 257/686 |
| 2007/0126914 A1 | 6/2007 | Komatsu et al. | |
| 2007/0164409 A1 | 7/2007 | Holland | |
| 2007/0166029 A1* | 7/2007 | Lee et al. | 396/529 |
| 2007/0212061 A1 | 9/2007 | Woo | |
| 2007/0236591 A1 | 10/2007 | Tam et al. | |
| 2007/0258006 A1 | 11/2007 | Olsen et al. | |
| 2007/0275505 A1 | 11/2007 | Wolterink et al. | |
| 2007/0278394 A1 | 12/2007 | Shangguan et al. | |
| 2007/0279518 A1 | 12/2007 | Apel et al. | |
| 2008/0040069 A1 | 2/2008 | Grziwa et al. | |
| 2008/0058010 A1 | 3/2008 | Lee | |
| 2008/0068728 A1 | 3/2008 | Westerweck et al. | |
| 2008/0074528 A1 | 3/2008 | Westerweck et al. | |
| 2008/0118241 A1 | 5/2008 | TeKolste et al. | |
| 2008/0143864 A1 | 6/2008 | Yamaguchi et al. | |
| 2008/0152339 A1 | 6/2008 | Westerweck et al. | |
| 2008/0158362 A1 | 7/2008 | Butterworth | |
| 2008/0159734 A1 | 7/2008 | Westerweck et al. | |
| 2008/0170141 A1 | 7/2008 | Tam et al. | |
| 2008/0180566 A1* | 7/2008 | Singh | 348/373 |
| 2008/0225415 A1 | 9/2008 | Bogue et al. | |
| 2008/0252770 A1 | 10/2008 | Raschke | |
| 2008/0252795 A1 | 10/2008 | Bone et al. | |
| 2008/0278617 A1* | 11/2008 | Tanida et al. | 348/340 |
| 2008/0279544 A1 | 11/2008 | Westerweck | |
| 2008/0279545 A1 | 11/2008 | Westerweck | |
| 2009/0015706 A1 | 1/2009 | Singh | |
| 2009/0021624 A1 | 1/2009 | Westerweck et al. | |
| 2009/0027869 A1 | 1/2009 | Uchida et al. | |
| 2009/0046376 A1 | 2/2009 | Westerweck et al. | |
| 2009/0068798 A1* | 3/2009 | Oliver et al. | 438/127 |
| 2009/0103193 A1 | 4/2009 | Berube | |
| 2009/0110385 A1 | 4/2009 | Toor et al. | |
| 2009/0115891 A1 | 5/2009 | Ryu et al. | |
| 2009/0122178 A1* | 5/2009 | Kwon et al. | 348/340 |
| 2009/0206431 A1* | 8/2009 | Bolken et al. | 257/432 |
| 2009/0243051 A1* | 10/2009 | Vanam et al. | 257/659 |
| 2009/0267170 A1 | 10/2009 | Chien et al. | |
| 2010/0044814 A1* | 2/2010 | Lin et al. | 257/432 |
| 2010/0053423 A1 | 3/2010 | Singh | |
| 2011/0037886 A1 | 2/2011 | Singh et al. | |
| 2011/0096213 A1 | 4/2011 | Hasegawa | |
| 2011/0134303 A1* | 6/2011 | Jung et al. | 348/340 |

FOREIGN PATENT DOCUMENTS

| | | |
|---|---|---|
| JP | S61-129616 A | 6/1986 |
| JP | 02-079685 A | 3/1990 |
| JP | H04-023469 A | 1/1992 |
| JP | 07-131701 A | 5/1995 |
| JP | H07-181389 A | 7/1995 |
| JP | H08-288484 A | 11/1996 |
| JP | H09-329818 A | 12/1997 |
| JP | 10-327344 A | 12/1998 |
| JP | 2000-155270 A | 6/2000 |
| JP | 2000-323692 A | 11/2000 |
| JP | 2001-292354 A | 10/2001 |
| JP | 2001-292365 A | 10/2001 |
| JP | 2001-333332 A | 11/2001 |
| JP | 2002-010123 A | 1/2002 |
| JP | 2002-016194 A | 1/2002 |
| JP | 2002-246638 A | 8/2002 |
| JP | 2002-280535 A | 9/2002 |
| JP | 2003-110891 A | 4/2003 |
| JP | 2004-016410 A | 1/2004 |
| JP | 2004-029554 A | 1/2004 |
| JP | 2004-053648 A | 2/2004 |

(56) References Cited

FOREIGN PATENT DOCUMENTS

| | | | |
|---|---|---|---|
| JP | 2004-061623 A | 2/2004 |
| JP | 2004-080774 A | 3/2004 |
| JP | 2004-088713 A | 3/2004 |
| JP | 2004-200965 A | 7/2004 |
| JP | 2004-207461 A | 7/2004 |
| JP | 2004-282778 A | 7/2004 |
| JP | 2004-226872 A | 8/2004 |
| JP | 2004-304605 A | 10/2004 |
| JP | 2004-328474 A | 11/2004 |
| JP | 2005-116628 A | 4/2005 |
| JP | 2005-148109 A | 6/2005 |
| JP | 2005-173265 A | 6/2005 |
| JP | 2005-266129 A | 9/2005 |
| JP | 2005-295050 A | 10/2005 |
| JP | 2005-317745 A | 11/2005 |
| JP | 2005-338749 A | 12/2005 |
| JP | 2005-340539 A | 12/2005 |
| JP | 2005-539276 A | 12/2005 |
| JP | 2006-054506 A | 2/2006 |
| JP | 2006-180487 A | 7/2006 |
| JP | 2006-248878 A | 9/2006 |
| JP | 2006-276897 A | 10/2006 |
| JP | 2006-294720 A | 10/2006 |
| JP | 2007-017974 A | 1/2007 |
| JP | 2007-292845 A | 11/2007 |
| JP | 4027962 B1 | 12/2007 |
| KR | 20050000722 A | 1/2005 |
| WO | WO 02/065208 A1 | 8/2002 |
| WO | WO 2004/027880 A2 | 4/2004 |
| WO | WO 2004/027880 A3 | 4/2004 |
| WO | WO 2005/069602 A2 | 7/2005 |
| WO | WO 2006/025698 A1 | 3/2006 |
| WO | WO 2006/093377 A1 | 9/2006 |
| WO | 2007016413 A2 | 2/2007 |
| WO | 2007016414 A2 | 2/2007 |
| WO | WO 2008/011003 A2 | 1/2008 |
| WO | 2008021167 A2 | 2/2008 |
| WO | 2008070125 A2 | 6/2008 |
| WO | 2008079403 A2 | 7/2008 |
| WO | 2008085489 A1 | 7/2008 |
| WO | 2008133943 A1 | 11/2008 |
| WO | 2008133946 A1 | 11/2008 |

OTHER PUBLICATIONS

NPL: Dictionary.com; Attach definition; http://dictionary.reference.com/browse/attach?s=t.*
NPL: Dictionary.com; Bearing definition; http://dictionary.reference.com/browse/bearing?s=t.*
PCT International Search Report, PCT/US2009/034528, Apr. 30, 2009.
JP Patent App. Serial No. 2010-506259, Office Action dated Oct. 7, 2013 (English translation).
PCT Application No. PCT/US09/034528 International Preliminary Report on Patentability dated Aug. 24, 2010.
CN Patent Application Serial No. 200980111373.3, Office Action dated May 17, 2012 (English Translation).
CN Patent Application Serial No. 200980111373.3, Office Action dated Feb. 17, 2013 (English Translation).
CN Patent Application Serial No. 200980111373.3, Office Action dated Aug. 21, 2013.
JP Application No. 2010-547748, Office Action dated Jun. 25, 2013 (English Translation).
U.S. Appl. No. 12/150,119, Office Action dated Dec. 16, 2010.
U.S. Appl. No. 12/150,119, Office Action dated Sep. 28, 2011.
U.S. Appl. No. 12/150,119, Office Action dated Apr. 30, 2012.
U.S. Appl. No. 12/150,119, Office Action dated Apr. 16, 2013.
U.S. Appl. No. 12/150,119, Office Action dated Oct. 18, 2013.
PCT Application No. PCT/US2008/005298, International Search Report and Written Opinion dated Sep. 2, 2008.
PCT Application No. PCT/US2008/005298, International Preliminary Report on Patentability dated Nov. 5, 2009.
CN Application No. 200880021357.0, Office Action dated Mar. 9, 2011 (English translation).
CN Application No. 200880021357.0, Office Action dated Mar. 30, 2012 (English translation).
CN Application No. 200880021357.0, Office Action dated Dec. 21, 2012 (English translation).
CN Patent Application Serial No. 200880021357.0, Office Action dated Jul. 3, 2013 (English translation).
JP Application No. 2010-506259, Office Action dated Oct. 17, 2011 (English translation).
JP Application No. 2010-506259, Office Action dated Jun. 11, 2012 (English translation).
JP Patent Application Serial No. 2012-226416, Office Action dated Sep. 11, 2013 (English translation).
U.S. Appl. No. 12/150,118, Office Action dated Dec. 20, 2010.
U.S. Appl. No. 12/150,118, Office Action dated Oct. 11, 2011.
U.S. Appl. No. 12/150,118, Office Action dated May 24, 2012.
U.S. Appl. No. 12/150,118, Notice of Allowance dated Dec. 14, 2012.
U.S. Appl. No. 12/150,118, Supplemental Notice of Allowance dated Jun. 13, 2013.
U.S. Appl. No. 12/150,118, Corrected Notice of Allowance dated Jul. 24, 2013.
U.S. Appl. No. 12/150,118, Corrected Notice of Allowance after IDS dated Sep. 26, 2013.
PCT Application No. PCT/US2008/005289, International Search Report and Written Opinion dated Sep. 2, 2008.
PCT Application No. PCT/US2008/005289, International Preliminary Report on Patentability dated Nov. 5, 2009.
CN Application No. 200880021337.3, Office Action dated Feb. 28, 2011 (English translation).
JP Application No. 2010-506257, Office Action dated Oct. 17, 2011 (English translation).
JP Application No. 2010-506257, Office Action dated Sep. 6, 2012 (English translation).
JP Patent Application Serial No. 2010-506257, OA dated Oct. 16, 2013 (English translation).
U.S. Appl. No. 12/583,193, Office Action dated Jan. 18, 2012.
U.S. Appl. No. 12/583,193, Office Action dated Oct. 12, 2012.
U.S. Appl. No. 12/583,193, Office Action dated Jun. 27, 2013.
PCT Application No. PCT/US2010/002251, International Search Report and Written Opinion dated Oct. 4, 2010.
PCT Application No. PCT/US2010/002251, International Preliminary Report on Patentability dated Feb. 23, 2012.
JP Application No. 2012-524704, Office Action dated Apr. 4, 2013 (English translation).
KR Application No. 10-2012-7006585, Office Action dated Mar. 4, 2013 (English translation).
U.S. Appl. No. 11/600,282, Restriction Requirement dated Oct. 9, 2009.
U.S. Appl. No. 11/600,282, Office Action dated Dec. 24, 2009.
U.S. Appl. No. 11/600,282, Office Action dated Jul. 23, 2010.
U.S. Appl. No. 11/600,282, Office Action dated Feb. 4, 2011.
U.S. Appl. No. 11/600,282, Office Action dated Jul. 6, 2011.
U.S. Appl. No. 11/600,282, Office Action dated Nov. 28, 2011.
U.S. Appl. No. 11/600,282, Abandonment Notice dated Jun. 8, 2012.
PCT Application No. PCT/US2007/023961, International Search Report & Written Opinion dated May 26, 2008.
PCT Application No. PCT/US2007/023961, International Preliminary Report on Patentability dated May 19, 2009.
CN Application No. 200780049903.7, Office Action dated Sep. 21, 2010 (English translation).
CN Application No. 200780049903.7, Office Action dated Jul. 13, 2011 (English translation).
EP Application No. 07840058.7-1524, Office Action dated Oct. 10, 2011.
JP Application No. 2009-0537200, Office Action dated Sep. 6, 2011 (English translation).
JP Application No. 2009-0537200, Office Action dated May 15, 2012 (English translation).
JP Application No. 2009-0537200, Decision of Refusal dated Feb. 12, 2013 (English translation).
JP Application No. 2009-0537200, Appeal Interrrogatory dated Sep. 10, 2013. (Non-English translation).

(56) References Cited

OTHER PUBLICATIONS

TW Application No. 2007 0143796, Office Action dated Jul. 28, 2011 (Non-English translation).
TW Application No. 2007 0143796, Office Action dated Jan. 17, 2013 (Non-English translation).
TW Application No. 2007 0143796, Decision of Refusal dated May 15, 2013 (English translation).
JP Patent Application Serial No. 2010-547748, Office Action dated Sep. 9, 2014 (English translation).
U.S. Appl. No. 12/150,119, Office Action dated May 7, 2014.
CA Patent Application Serial No. 2,685,083, Office Action dated Nov. 20, 2013.
CN Patent Application Serial No. 200880021357.0, Office Action dated Apr. 11, 2014 (English translation).
CA Patent Application Serial No. 2,685,080, Office Action dated Nov. 20, 2013.
JP Patent Application U.S. Appl. No. 2013-043381, Office Action dated Jan. 22, 2014 (English translation).
U.S. Appl. No. 12/583,193, Office Action dated Apr. 16, 2014.
U.S. Appl. No. 12/583,193, Interview Summary dated Jul. 28, 2014.
CN Patent Application Serial No. 201080046149.3, Office Action dated May 5, 2014 (English translation).
*Microchip Fabrication*, 5$^{th}$ *edition*; Van Zant, Peter; McGraw-Hill Companies, Inc.; New York; Copyright 2004; p. 616.

\* cited by examiner

ATTACHMENT OF WAFER LEVEL OPTICS

CROSS-REFERENCE TO RELATED APPLICATIONS

This application claims priority under 35 U.S.C. 119 to U.S. Provisional Patent Application No. 61/030,937, entitled "Attachment of Wafer Level Optics," filed Feb. 22, 2008, the contents of which are incorporated herein by reference.

BACKGROUND

In the field of consumer electronic devices, such as wireless phones, there is constant pressure to make the devices more compact, less expensive, and more rich with features. In turn, the manufacturers of such devices place the same pressures on each of its component suppliers. As most wireless phones today are camera phones, they each include one or more camera modules as a component of the phone. The camera module may include a PCB or flex circuit, an image sensor, a housing, and a lens assembly.

Thus, it is desirable for camera modules to be compact, inexpensive, and to have increased capabilities. These capabilities may include higher resolution image sensors and higher-quality optics/lenses. Further, it is desirable to minimize the components and materials used in manufacturing a camera module, to reduce the time to manufacture such modules, to reduce the human involvement in manufacturing such modules, and to decrease the number of defective modules produced.

Typically, camera modules are manufactured by attaching the image sensor to a circuit board and then attaching a housing containing the lens to the same circuit board. Alternatively, other manufacturing techniques include covering the image sensor with a cover glass and then attaching the lens or lens housing to the cover glass. In some cases, the lens is contained in a lens assembly that is threadedly received in a housing and the lens assembly is rotated until it provides a properly focused image for the image sensor. At this point, the lens assembly can be fixed to the housing.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

A camera module assembly is provided that includes a substrate, an image sensor coupled to the substrate, and an optics stack attached directly the image sensor. Variations of the camera module assembly may also include a housing that is coupled to the substrate and the optics stack. Glue, epoxy, adhesive, tape, or any other appropriate attachment mechanism may be used to couple the housing to the substrate and the optics stack and/or to couple the optics stack to the image sensor.

Another camera module assembly is provided that includes an image sensor and an optics stack attached directly to a top surface of the image sensor. Variations of this camera module assembly may include partially encapsulating the optics stack in molding material, where the molding material includes an opening to allow light to pass through the molding material to the optics stack. In addition, a substrate may be attached directly to a bottom surface of the image sensor. The substrate may include vias that extend through the substrate from an exterior surface of the substrate to bond pads located on the bottom surface of the image sensor. The vias may be filled with conductive material, and solder balls may be attached to the vias at the exterior surface of the substrate.

In addition, a method for producing camera modules is provided that includes: (1) providing a wafer that includes a plurality of image sensors; (2) coupling an optics stack directly to each of the image sensors; (3) partially encapsulating the optics stack with transfer molding, leaving an opening through the transfer molding to allow light to pass through to the optics stack; and (4) singulating the assembly into separate camera modules.

Variations of the method for producing camera modules may include each of the optics stacks having one or more lens elements located a designated distance from the image sensor. The designated distance may have a tolerance of 5 μm or less.

Another method for producing camera modules is provided that includes: (1) providing a substrate that has an image sensor; and (2) coupling an optics stack directly to the image sensor.

Variations of the above-noted method for producing camera modules may include coupling a housing directly to the substrate such that the housing is disposed about the image sensor and the optics stack. In addition, the housing may include an upper port to allow light to pass through the housing to the optics stack.

In addition to the exemplary aspects and embodiments described above, further aspects and embodiments will become apparent by reference to the drawings and by study of the following descriptions.

DETAILED DESCRIPTION

Reference will now be made to the accompanying drawings, which assist in illustrating the various pertinent features of the present invention. Although the present invention will now be described primarily in conjunction with a camera module, it should be expressly understood that the present invention may be applicable to other applications where it is desired to attach optics to an electronic circuit. In this regard, the following description of the attachment of wafer level optics to an image sensor in a camera module is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

Figure 1:
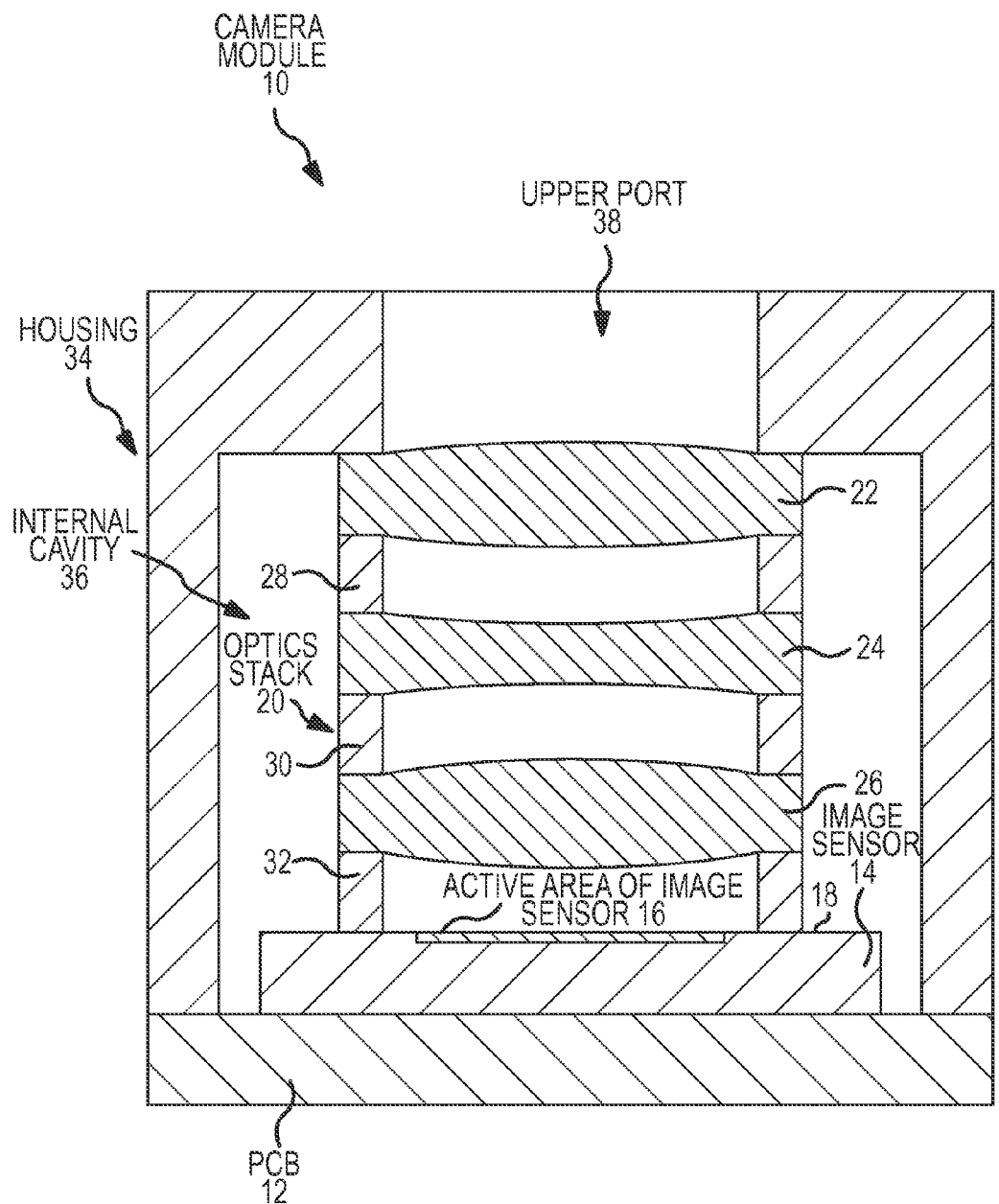
FIG. 1 is a cross-sectional view of a camera module produced by the techniques described herein.

FIG. 1 shows an assembled camera module 10. The camera module 10 includes a printed circuit board (PCB) 12 to which an image sensor 14 has been attached using chip-on-board (COB) technology. The image sensor 14 includes an active area 16 in a central region of a top surface 18 thereof. An optics stack 20 has been attached to the top surface 18 of the image a sensor 14 so as to surround the active area 16. The optics stack 20 includes one or more lens elements. In this example, the optics stack 20 includes three lens elements, a first lens element 22, a second lens element 24, and a third lens element 26. The three lens elements 22, 24, and 26 are separated from each other and from the image sensor 14 by a first spacer 28, a second spacer 30, and a third spacer 32, respectively. Other examples of optics stacks may include one, two, four, or more lens elements.

The optics stack may be manufactured with replication technology (using molds) that is known in the art. The optics stack may include aspheric lens surface on either side of one or more lens elements. Each of the spacers 28, 30, and 32 are hollow, having a cavity in a central region thereof to allow light to pass through each successive lens element, as light passes through the camera module 10 toward the active area 16 of the image sensor 14. The spacers may be composed of any suitable material, with two examples being glass or polymer materials. Three examples of companies that have replication technology are Anteryon, Tessera/Digital Optics Corporation, and Heptagon.

A housing 34 (which may be composed of CBT, LCP, glass, or other suitable material) is attached to the PCB 12 and the top of the optics stack 20 to minimize the amount of stray light impinging upon the active area 16 of the image sensor 14 and to increase the mechanical strength of the camera module 10. The housing 34 includes an internal cavity 36 that receives the optics stack 20 and image sensor 14. The housing 34 also includes an upper port 38 through which light can enter the camera module 10, pass through the optics stack 20, and impinge upon the active area 16 of the image sensor 14. The upper port 38 may be of any suitable shape. In this example, the upper port is a rectangular opening, while in other examples other shapes may be used. For example, a smaller, circular opening may be employed.

Figure 2:
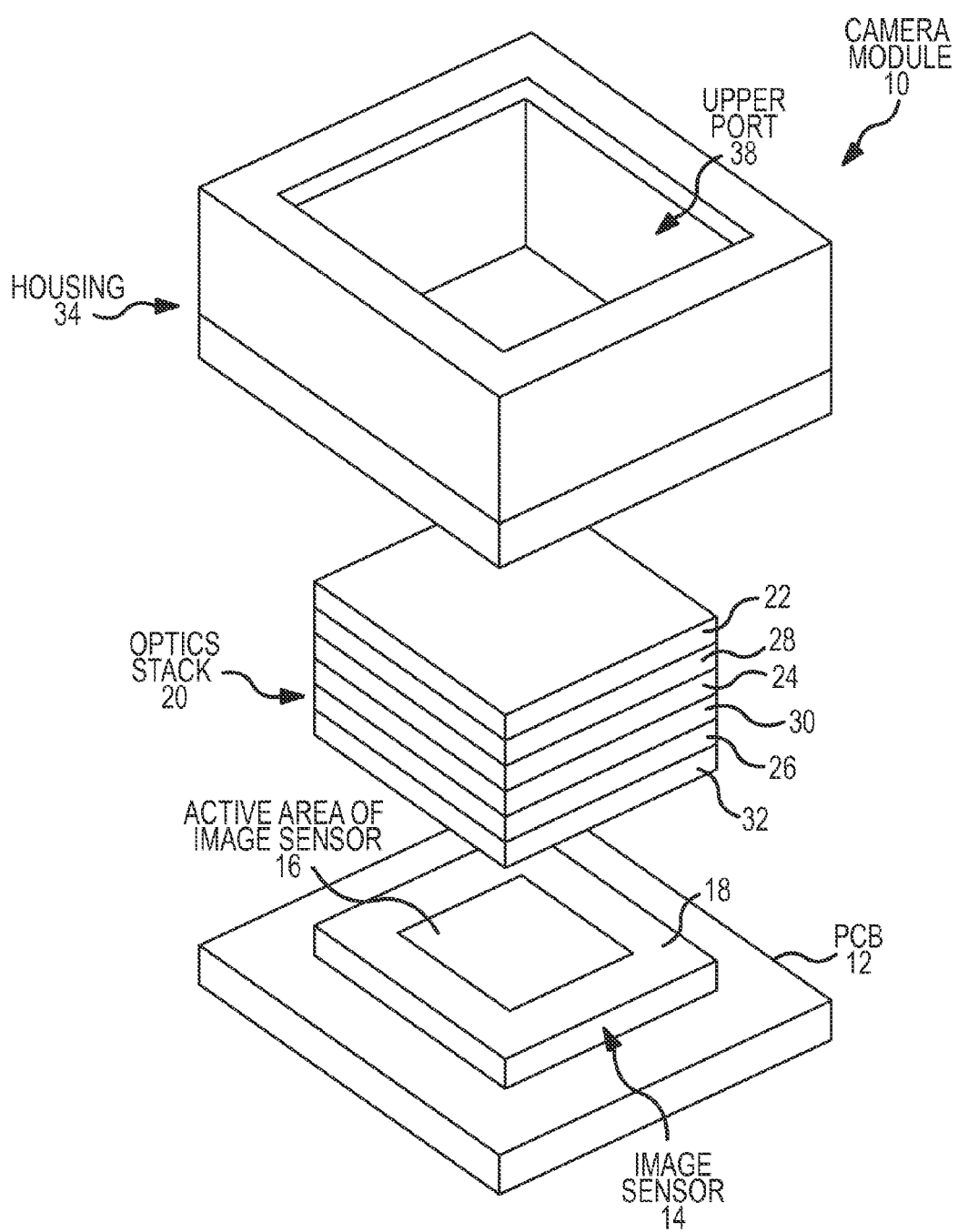
FIG. 2 is an exploded view of the camera module of FIG. 1, showing an image sensor already mounted on a circuit board, and optics stack, and a housing.
Figure 3:
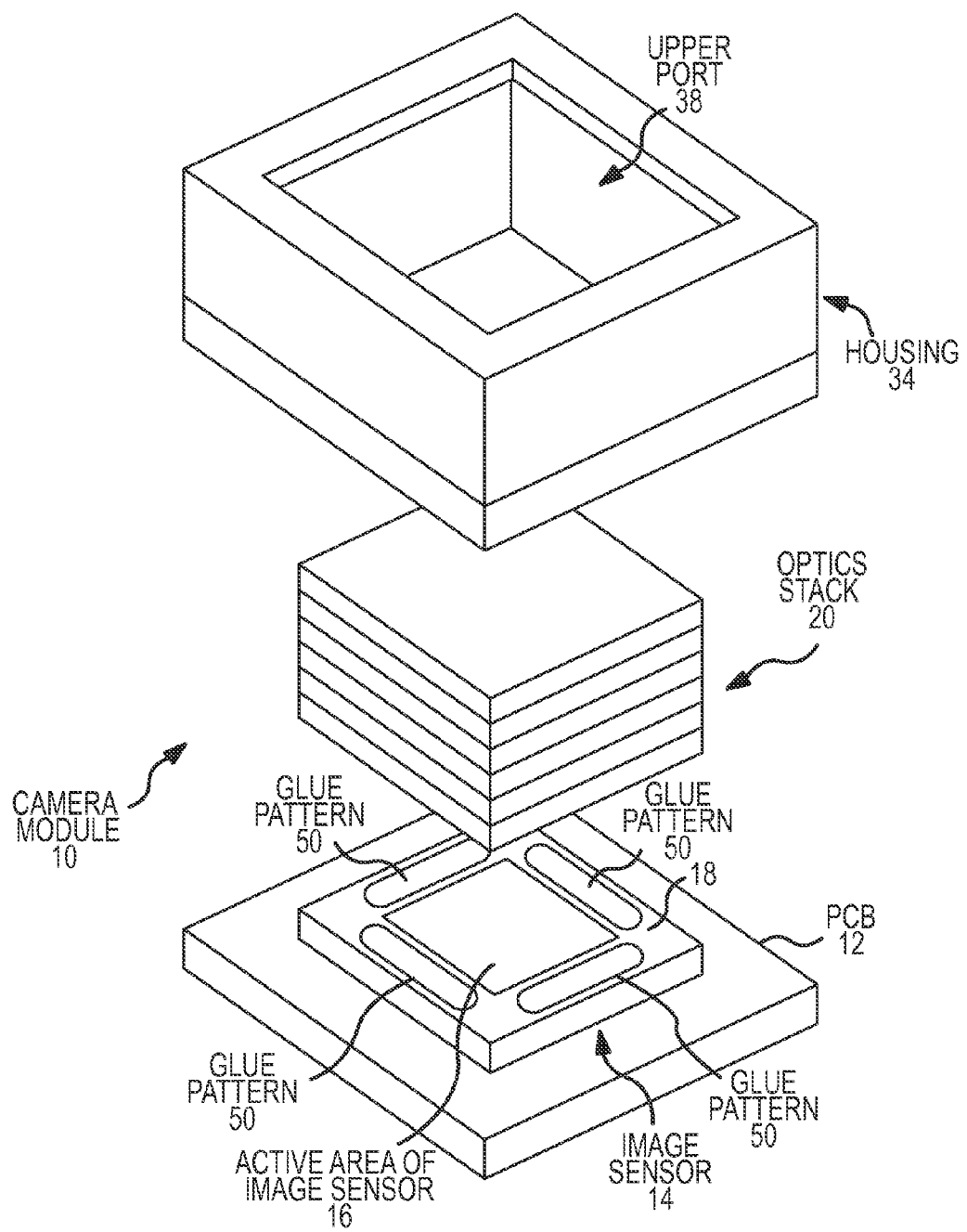
FIG. 3 is similar to the exploded view of FIG. 2, shown after glue has been applied to a peripheral area of the image sensor.

A process for assembling the camera module 10 of FIG. 1 is shown in FIGS. 2-6. FIG. 2 shows an image sensor 14 (with its active area 16 on a top surface 18 thereof) already attached to the PCB 12. The initial portions of this process may be performed in a clean room having special vacuum features. The optics stack 20 (including lens elements 22, 24, and 26 and spacers 28, 30, and 32) is shown spaced apart from the combination of the image sensor 14 and PCB 12. In turn, the housing 34 is shown spaced apart from the optics stack 20. While the combination of the housing 34, the optics stack 20, and the image sensor 14 and PCB 12 are shown in spaced apart relationship in FIG. 2, this is merely for ease of understanding and illustration. In fact, the housing 34 and optics stack 20 may of course be located in different positions or in a completely different location while the step illustrated by the differences between FIGS. 2 and 3 is performed.

As can be seen in FIG. 3, four lines of glue 50 have been applied to a peripheral area on the top surface 18 of the image sensor 14. The dispense pattern may be broken lines of glue applied to the peripheral area of the image sensor (as shown) or it may be a continuous line of glue or multiple dots of glue applied to the peripheral area of the image sensor. Any suitable glue, epoxy, or other type of adhesive can be used and a precision or semi-automatic dispensing method may be used. One example of a suitable glue is Ablelux A4502. Care is taken to accurately place the glue lines an appropriate distance away from the active area 16 of the image sensor 14. For example, each glue line may be spaced apart from the active area 16 by a distance of 300 µm or greater, while the width of each glue line may be in the range of 300 to 350 µm, for example. Since the thickness of the glue line helps determine the spacing of the lens elements in the lens optics stack 20 from the active area 16 of the image sensor 14, it may be desirable to maintain the thickness of the glue line at a reasonable level (for example ~12-15 um). In addition, it may be desirable to control the viscosity (for example ~20,000 cps) and thixotropic index (for example ~3-5) of the glue. It should be appreciated that, in addition to the lines of glue 50 on the top surface 18 of the image sensor 14, there may be lines of glue applied to the bottom surface of the optics stack 20, particularly the bottom surface of the third spacer 32. Alternatively, glue could be applied only to the optics stack 20 and no glue applied to the image sensor 14. As another alternative, double-sided tape or B-stage epoxy could be used to attach the optics stack 22 to the image sensor 14.

Figure 4:
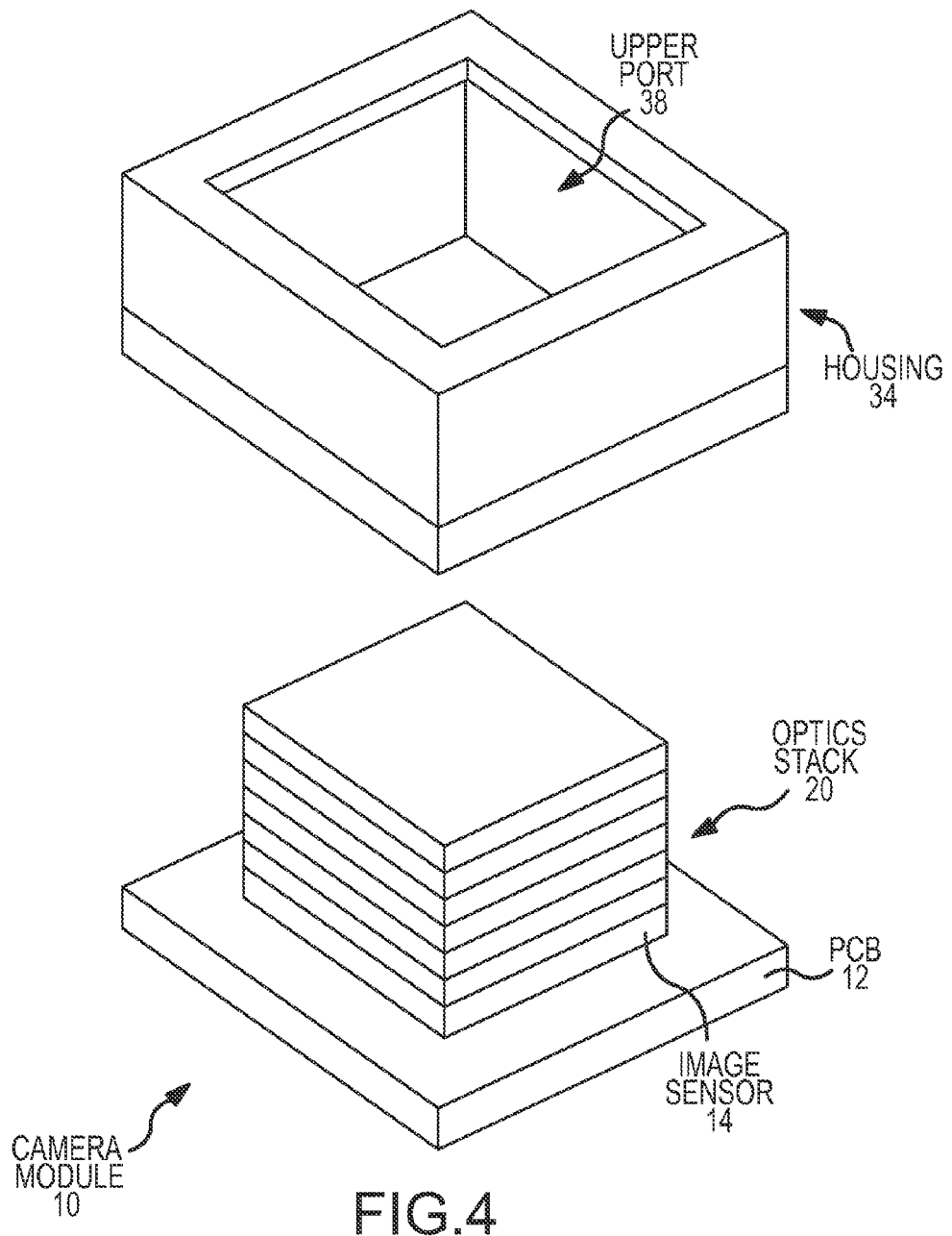
FIG. 4 is similar to the exploded view of FIG. 3, shown after an optics stack has been attached to the image sensor.

Next, the optics stack 20 is picked up and attached to the image sensor 14 using precision or semi-automatic assembly equipment. Once the optics stack 20 has been attached to the image sensor 14, there is no further need for the subsequent assembly processes to be conducted in a clean room. This is because the sensitive, active area 16 of the image sensor 14 is now covered, reducing the possibility of contamination. FIG. 4 shows the partial assembly of the camera module in which the optics stack 20 has already been attached to the image sensor 14. At this point, the partially assembled camera module is subjected to UV light to cure the glue. Alternatively, a thermal-setting (or other type of) glue can be used, and appropriate methods can be used to cure that adhesive.

Figure 5:
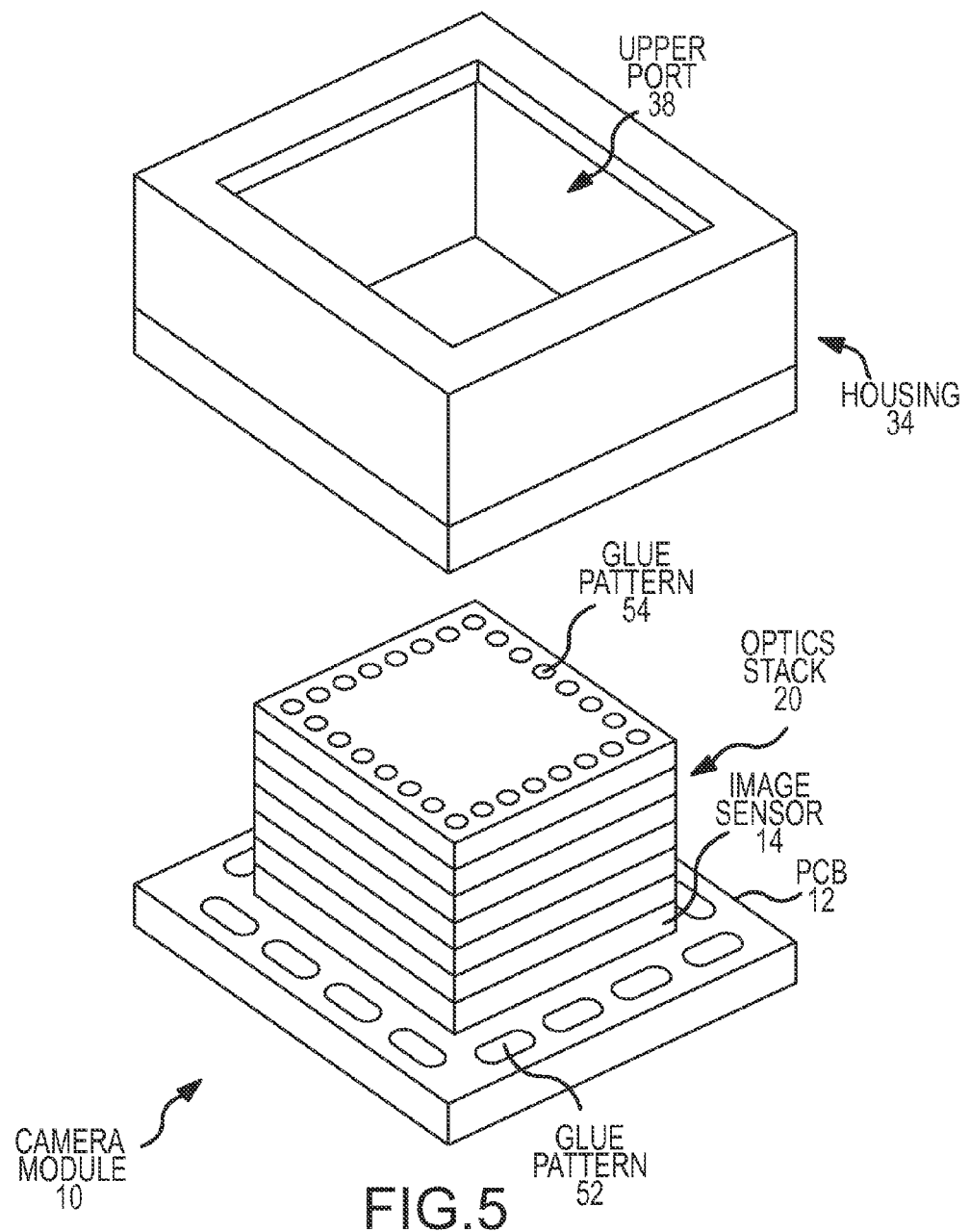
FIG. 5 is similar to the exploded view of FIG. 4, shown after glue has been applied to a peripheral area of the circuit board and a peripheral area on top of the optics stack.

Next, in one option for attaching the housing 34 to the remainder of the camera module 10 to complete the assembly, glue is provided, both along the periphery of the upper surface of the first lens element 22 and along the outer periphery of a top surface of the PCB 12, as shown in FIG. 5. In addition, glue could be applied to the appropriate mating surfaces on the housing 34. Alternatively, there may be no glue applied to the optics stack 20 and PCB 12 and it may only be applied to the mating portions on the housing 34. As a further alternative, two-sided tape may be used to apply to attach to be housing 34 to the remainder of the camera module 10.

There are many suitable glue patterns that could be employed. As an alternative to the glue lines 50 shown in FIG. 3, in this example dashed glue lines 52 are used on the PCB 12 and a series of glue dots 54 is used on the periphery of the first lens element 22 of the optics stack 20. Of course, any of these types of glue patterns 50, 52, and 54, and any other suitable pattern, could be used in any of these three locations shown in FIGS. 3 and 5.

The housing 34 is then attached, either manually using jigs and fixtures, or by use of an automated housing attach system.

Figure 6:
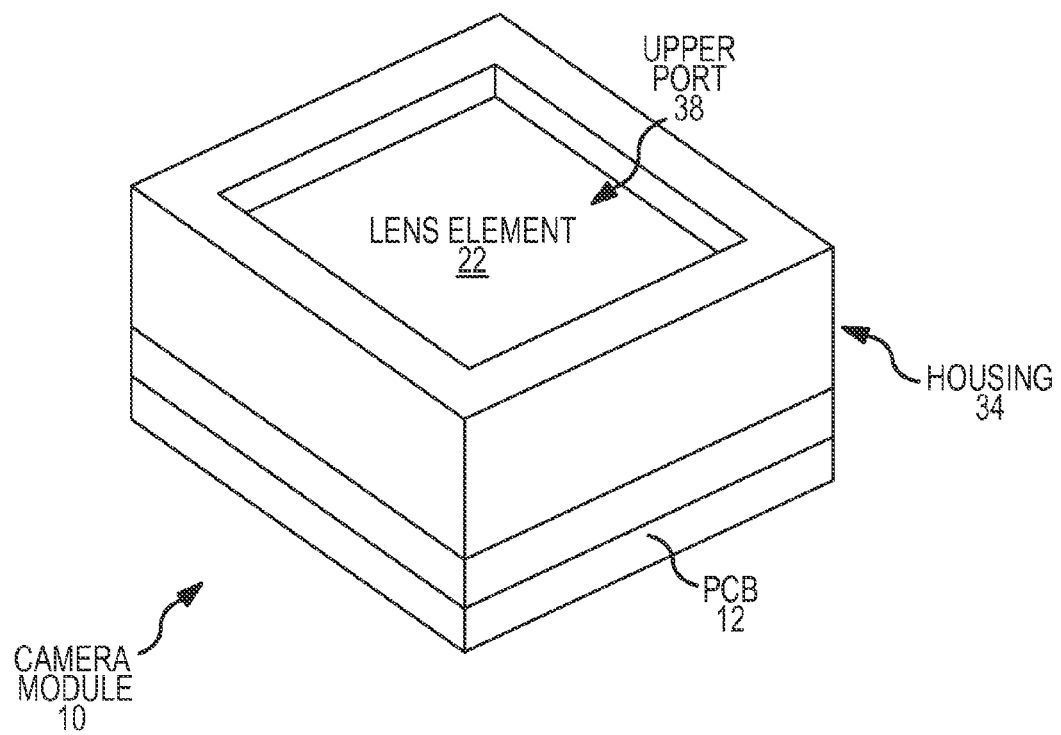
FIG. 6 is similar to the exploded view of FIG. 5, shown after a housing has been attached to the portions of the camera module having the exposed glue.

The camera module is then placed in an oven to cure the epoxy (in this example a thermal-setting glue is used to attach the housing 34). In this manner, the assembled camera module 10 is produced, as shown in FIG. 6.

Figure 7:
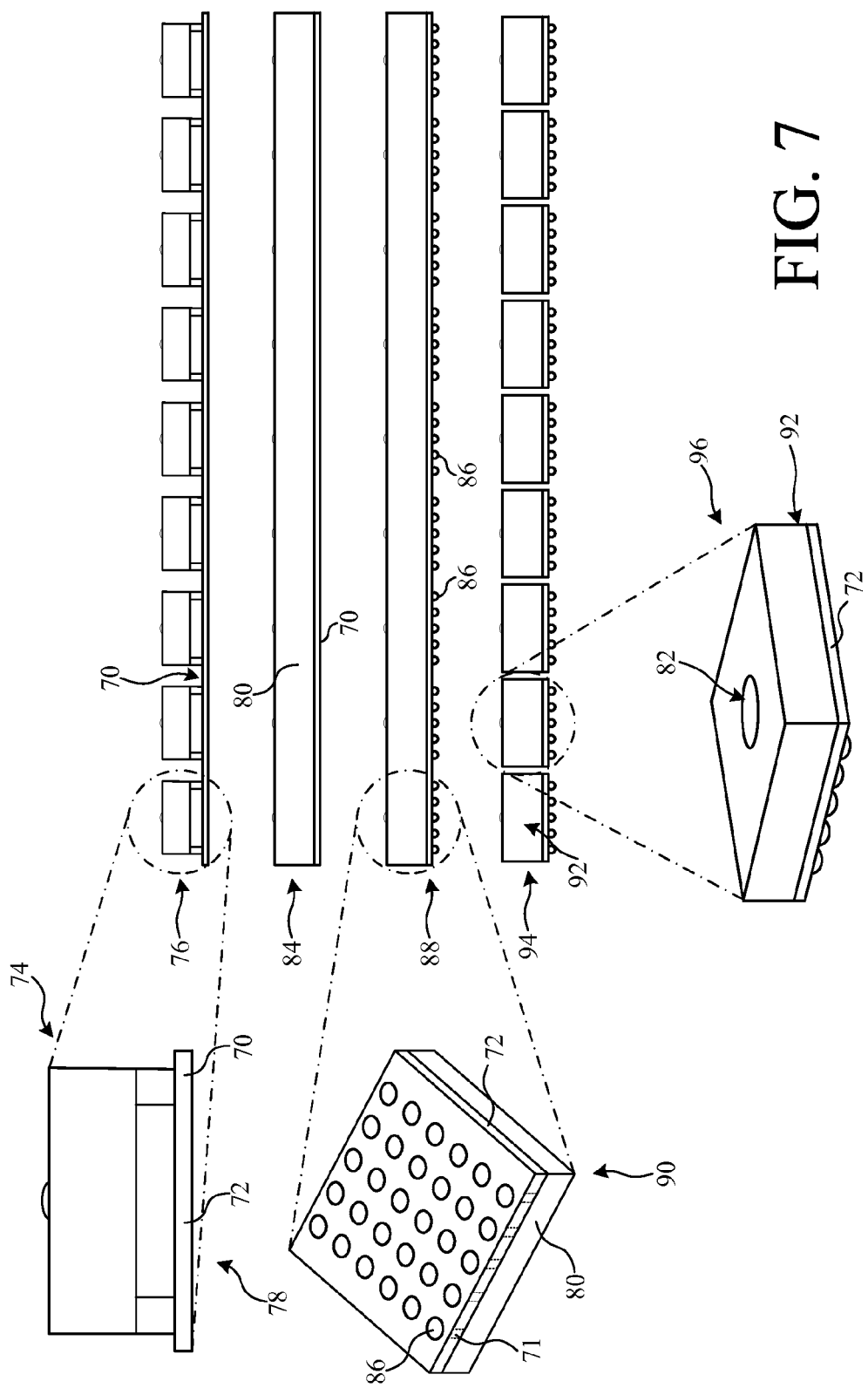
FIG. 7 is a diagram showing the various stages in an array processing technique for producing multiple camera modules.

While the above description describes techniques for assembling a single camera module 10, it may be desirable to produce multiple camera modules with array processing. Such a technique is shown in the various drawings of FIG. 7. In this example, a silicon wafer 70 that includes a plurality of non-singulated image sensors 72 thereon is employed. The wafer may be any suitably-sized wafer. For example, a 6 inch, 8 inch, or 12 inch wafer could be used. In this example, a through silicon via (TSV) wafer is employed. TSV technology is known in the art and examples of such technology are available from Micron and STMicroelectronics. As is well known, a TSV wafer has already had vias created from a bottom surface of the wafer to the bond pads on the bottom of the image sensors 72. The bond pad connections are brought to the bottom side through these vias in the silicon using redistribution technology (RDL) and are distributed over the entire bottom side. These TSV vias are filled with conductive and dielectric material and terminated on the bottom side where solder balls are attached at a later stage.

In a manner similar to that shown in FIGS. 3 and 4, and described in the accompanying descriptions, an optics stack 74 is attached to each of the image sensors 72 on the wafer 70. The wafer 70, with a plurality of optics stacks 74 attached thereto, is shown at 76. A magnified view of one of the optics stacks 74 attached to one of the image sensors 72 on the wafer 70 is shown at 78.

Next, through a conventional molding process known as transfer molding, the optics stacks 74 on the wafer are encapsulated with molding material 80, with an opening 82 through the molding material defined so that light can pass into the optics stack 74 and to the image sensor 72. The wafer 70, with the molding material 80 encapsulating the optics stack 74, is shown at 84.

Next, vias 71 in the TSV wafer 70 that were filled with conductive material and terminated on the bottom side go through a solder ball attach process to facilitate subsequent connection to an electronic circuit (not shown). The solder ball attach process may be a reflow process. The wafer 70, with solder balls 86 attached thereto, is shown at 88. A magnified view of one of the image sensors 72 of the wafer 70, with solder balls 86 attached thereto is shown at 90.

Next, the wafer 70 is singulated in a conventional manner with a saw and then the molding material 80 is singulated in a conventional manner with a saw. For example, the dicing of the wafer 70 and the molding material 80 may occur from opposite sides of the assembly. Alternatively, the wafer 70 in the molding material may be singulated in a single step with a saw from the same side of the assembly. Alternatively, the assembly can be singulated into separate camera modules in any conventional manner. Once the assembly has been singulated, a plurality of assembled camera modules 92 is thereby produced. An example of such a plurality of camera modules 92 is shown at 94. A magnified view of one of the camera modules 92 is shown at 96.

It should be appreciated that the techniques disclosed herein offer several advantages to prior techniques. It is believed that the techniques described herein are the first to attach an optics stack, or any type of lens directly to the silicon of an image sensor in the assembly of a camera module. It is believed that in other assembly methods, the optical elements are either attached to a cover glass that is attached to the silicon of the image sensor, or attached to the PCB to which the image sensor is attached, or the optical elements are attached to a lens housing that is attached to the PCB.

By attaching the optics stack directly to the image sensor, the overall tolerance level of the distance of the lens elements from the image sensor is greatly reduced. For example, in techniques where a cover glass is used and the optics are attached to the cover glass, the cover glass may generally have a thickness of 300 to 500 μm and a tolerance in the range of 10 to 100 μm. With the techniques taught herein, it has been found that the overall tolerance of the distance of the lens elements from the image sensor can be reduced to a level of less than 5 μm. In addition to significantly reducing the tolerance, the techniques taught herein eliminate the material cost and production time of attaching a cover glass to the sensor.

Further, it is believed that no previous camera module assembly techniques have ever used transfer molding to encapsulate an optics stack to form a housing for a camera module. In addition, it is believed that transfer molding has never been used to encapsulate an entire wafer of image sensors, each having an optics stack attached thereto.

Still further, it is believed that no previous techniques for assembling camera modules have ever attached solder balls to the TSV vias terminated on the bottom side of a full wafer when the optics have already been attached to an opposite side of the wafer. Similarly, this has never previously been done when transfer molding is already provided on the opposite side thereof.

Also, it is believed that no previous technique for assembling camera modules has ever taught singulation of an entire wafer when the optical elements and transfer molding are already attached.

As previously described, many other types of camera modules included a housing and a lens assembly that was threadedly received within the housing. In such an arrangement, the lens assembly was rotated until the image at the image sensor was properly focused. At that point, the lens assembly would be fixed relative to the housing. As can be seen, the techniques taught herein are superior to such an adjustable focus technique, as there are no moving parts. Further, since there are no moving parts, there are no particles generated by the relative movement of the parts that can cause contamination of the active area of the image sensor. Because of the small tolerance and accurate location of the lens elements relative to the image sensor, a good focused image is produced.

Also, by using a TSV wafer, several piece parts, such as a substrate, housing, and gold wire for wire bonding can be eliminated. This helps to improve and lower the cost of producing such camera modules.

The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. Accordingly, it should be understood that the particular values of the circuit component's described herein could be varied and achieve the same objectives. The values given herein are merely exemplary. It is therefore intended that the following appended claims and claims hereafter introduced are interpreted to include all such variations, modifications, permutations, additions, and sub-combinations as are within their true spirit and scope.

What is claimed is:

1. A camera module assembly, comprising:
an image sensor having a top surface, including an active sensor area, and a bottom surface having a set of bond pads formed on the bottom surface, the top surface of the image sensor having an inner region and an outer region, the inner region of the top surface including the active sensor area and a peripheral area around the active sensor area and within the outer region; and
an optics stack including a plurality of lens elements, the optics stack having a top surface and a bottom surface, the bottom surface of the optics stack being bonded directly to the inner region of the top surface of the image sensor without a focusing operation, wherein a focus of the image sensor is achieved solely through the direct attachment of the optics stack to the top surface of the image sensor, and wherein a vertical position of the optics stack is established solely via placement of the optics stack on the top surface of the image sensor; and
a unitary housing bonded directly to the outer region of the top surface of the image sensor and bonded directly to a portion of the top surface of the optics stack; and
wherein the image sensor is an integrated circuit die.

2. A camera module assembly as defined in claim 1, wherein the housing is formed from a molding material partially encapsulating the optics stack and defining an opening through the molding material to allow light to pass therethrough to the optics stack.

3. The camera module as defined in claim 1, wherein the camera module is free of moving parts.

4. The camera module as defined in claim 1, further comprising a set of solder balls, each of the solder balls being attached to a respective one of the bond pads.

5. A method for producing camera modules, comprising:
providing a silicon wafer including a plurality of image sensors, each of the image sensors having a top surface, including an active sensor area, and a bottom surface having a set of bond pads formed thereon, the top surface of each image sensor having an inner region and an outer region, the inner region of the top surface including the active sensor area and a peripheral area around the active sensor and within the outer region;
coupling a plurality of optics stacks thereto, including coupling an optics stack directly to the top surface of each of the image sensors, each optics stack having a top surface and a bottom surface, the bottom surface of each optics stack being bonded directly to the inner region of a top surface of a respective one of the image sensors;
encapsulating the assembly of image sensors and optics stacks with transfer molding, leaving a plurality of openings, with an opening corresponding to each optics stack through the transfer molding defining a physical hole in each case to allow light to pass therethrough, the step of transfer molding including applying molten molding material directly on the outer regions of the top surfaces of the image sensors and a portion of the top surfaces of the optics stacks to create a unitary housing for each combination of images sensors and optical stacks; and
singulating the assembly into separate camera modules.

6. A method as defined in claim 5, wherein the wafer includes conductive vias therethrough, and wherein solder balls are attached to the vias at an exterior surface of the wafer.

7. A method as defined in claim 6, wherein the vias extend from the exterior surface of the wafer to the circuitry of the image sensors.

8. A method as defined in claim 6, wherein the step of transfer molding is carried out after the step of coupling the plurality of optics stacks to the wafer.

9. A method as defined in claim 8, wherein the step of attaching the solder balls to the bond pads is carried out after the step of transfer molding.

10. A method as defined in claim 9, wherein the step of singulating the assembly into separate camera modules is carried out after the step of attaching the solder balls to the bond pads.

11. A method as defined in claim 5, wherein each optic stack includes one or more lens elements, wherein each lens element is located a designated distance from the image sensor, and where each designated distance has a tolerance of no more than 5 µm.

12. A method for producing camera modules, comprising:
providing an image sensor having a top surface, including an active sensor area, and a bottom surface having a set of bond pads formed thereon, the top surface further including an inner region and an outer region;
providing an optics stack including a plurality of lens elements affixed together, each optics stack having a top surface and a bottom surface;
attaching the bottom surface of the optics stack directly to the inner region of the top surface of the image sensor without a focusing operation;
providing molding material; and
applying the molding material in a molten state directly to the outer region of the top surface of the image sensor and at least a portion of the top surface of the optics stack to create a unitary housing for the image sensor and optical stack; and
wherein the image sensor is an integrated circuit die.

13. A method as defined in claim 12, wherein the step of providing an image sensor includes forming a set of vias through the image sensor, each via extending from the top surface of the image sensor to the bond pads formed on the bottom surface of the image sensor.

14. A method as defined in claim 13, wherein the step of applying the molding material is carried out after the step of attaching the bottom surface of the optics stack to the inner region of the top surface of the image sensor.

15. A method as defined in claim 14, further comprising attaching solder balls to the bond pads after the step of applying the molding material.

* * * * *